US009343335B1

(12) United States Patent
Kukas

(10) Patent No.: US 9,343,335 B1
(45) Date of Patent: May 17, 2016

(54) CLEANING PHOTORESIST NOZZLES FOR COATER MODULE

(71) Applicant: Alan W. Kukas, Santa Clara, CA (US)

(72) Inventor: Alan W. Kukas, Santa Clara, CA (US)

(73) Assignee: Spintrac Systems, Inc., Santa Clara, CA (US)

( * ) Notice: Subject to any disclaimer, the term of this patent is extended or adjusted under 35 U.S.C. 154(b) by 460 days.

(21) Appl. No.: 13/874,634

(22) Filed: May 1, 2013

(51) Int. Cl.
*B08B 9/00* (2006.01)
*H01L 21/67* (2006.01)

(52) U.S. Cl.
CPC .............................. *H01L 21/67051* (2013.01)

(58) Field of Classification Search
None
See application file for complete search history.

(56) References Cited

U.S. PATENT DOCUMENTS

| 4,668,334 | A | 5/1987 | Doorvveld |
| 5,066,616 | A | 11/1991 | Gordon |
| 5,911,090 | A | 6/1999 | Orth |
| 5,939,139 | A | 8/1999 | Fujimoto |
| 6,210,481 | B1 | 4/2001 | Sakai et al. |
| 6,612,319 | B1 | 9/2003 | Rangarajan et al. |
| 6,723,168 | B2 | 4/2004 | Kao et al. |
| 7,247,209 | B2 | 7/2007 | Robertson et al. |
| 7,879,152 | B2 | 2/2011 | Lee |
| 7,891,365 | B2 | 2/2011 | Hirao et al. |
| 8,043,443 | B2 | 10/2011 | Lee |
| 2011/0083703 | A1 | 4/2011 | Hirao et al. |

FOREIGN PATENT DOCUMENTS

JP 2003010767 A * 1/2003

* cited by examiner

*Primary Examiner* — Eric Golightly
(74) *Attorney, Agent, or Firm* — Thomas Schneck

(57) ABSTRACT

Methods and systems for cleaning photoresist dispense nozzles of a wafer processing photoresist coater module are disclosed. A method comprises dispensing a photoresist cleaning solvent from an edge bead removal dispense of the coater module onto a central portion of a substrate disposed on a spin chuck to form a puddle, making contact between the photoresist dispense nozzles and the puddle and washing for a select amount of time, thereby removing photoresist from the photoresist dispense nozzles. A system comprises a process controller controlling positioning of the photoresist dispense nozzles over the substrate, positioning of the edge bead dispense over the central portion of the wafer, dispensing photoresist cleaning solvent on the central portion of the wafer, and positioning of the spin chuck such that the photoresist dispense nozzles contact the solvent for cleaning.

18 Claims, 6 Drawing Sheets

CLEANING PHOTORESIST NOZZLES FOR COATER MODULE

TECHNICAL FIELD

The invention pertains in general to methods and systems for cleaning photoresist dispense nozzles and in particular to methods and systems for cleaning photoresist dispense nozzles of a wafer processing coater module.

BACKGROUND ART

In photolithography, photoresist is used to create a pattern of layers on a substrate. Wafer processing photoresist coater modules are known in the art. For example, U.S. Pat. No. 5,911,090 to Orth describes a prior art wafer processing photoresist coater module, adapted here as FIG. 1. The prior art coater module 100 includes a substrate 102, for example a wafer, loaded on a spin chuck 104. A photoresist dispense nozzle 106 is used to dispense photoresist 108 onto the substrate 102 in the form of droplets. Photoresist dispense motor 114 drives the dispensation of the photoresist. The spin chuck 104 is rotated with a spinner motor 107 to spread and coat the surface on the substrate 102 with photoresist 108. The spin chuck 104 is also spun to distribute the photoresist cleaning solvent 110 dispensed from edge bead dispense nozzle 112. The edge bead dispense nozzle dispensation is driven by edge bead dispense (EBD) motor 120. The edge bead dispense nozzle 112 and the photoresist nozzle 106 may be disposed on a robotic arm 116 connected to a robotic arm motor 118 for positioning the arm when dispensing photoresist and photoresist cleaning solvent. Operations of the coater module are controlled by a process controller 122.

During the coating process, photoresist coating material can collect and form an edge bead along the edge of the wafer. A problem with edge beads is that they may flake and create small particles which may cause defects in the wafer. The edge bead removal dispense nozzle 112 is used to dispense photoresist cleaning solvent 110 such as an edge bead removal solvent on the wafer edge to dissolve the edge bead.

Another common cause of defects and variability in photoresist coatings is the tendency of photoresists to dry rapidly and to form residues on the photoresist dispense nozzles. These residues can obstruct an orifice of the photoresist dispense nozzle which affects the amount and way in which the photoresist is dispensed. Particles of dried photoresist formed from the photoresist solution on the nozzle may contaminate the photoresist solution or fall directly onto the substrate. It is thus important for photoresist dispense nozzles to remain free of dried photoresist particles.

The following are some known photoresist dispense nozzle cleaning methods and systems. U.S. Pat. No. 7,879,152 to Lee discloses an apparatus for cleaning pollutant of the nozzle comprising a nozzle in a polluted state, a nozzle cleaning unit to clean a pollutant material from the nozzle by use of an absorbing member, and an absorbing member cleaning unit to clean a pollutant material from the absorbing member.

U.S. Pat. No. 7,891,365 to Hirao et al. discloses a nozzle cleaning apparatus and a nozzle cleaning method with the apparatus including a nozzle accommodated in a cleaning container having a funnel shaped portion. In the method, a cleaning solvent is supplied along an inner surface of the funnel shaped portion. The solvent forms a whirling vortex flow around the nozzle for cleaning.

It is an objective of the present invention to provide new and improved methods and systems for cleaning a photoresist dispense nozzle.

SUMMARY

The invention comprises methods and systems for cleaning photoresist dispense nozzle(s) present in a wafer processing photoresist coater module. One or more photoresist nozzles may be present in the coater module. In a method of the invention, an edge bead dispense nozzle is used to dispense photoresist cleaning solvent onto a central location of a wafer disposed on a spin chuck of a coater module forming a puddle. The photoresist dispense nozzles are washed in the puddle thereby removing photoresist from the dispense nozzles, in particular, tips or lower portions of the nozzles. In one embodiment contact between the nozzles and the puddle is sufficient for washing the nozzles. In one example, the photoresist dispense nozzles and the edge bead dispense nozzle are disposed on a moveable arm which is moved to a location where the edge bead dispense nozzle is able to dispense photoresist cleaning solution to the central location of the wafer. The spin chuck may be moved upwardly towards the moveable arm so that the photoresist dispense nozzles are placed in contact with the puddle. In one embodiment, the photoresist dispense nozzles are soaked in the puddle for a desired amount of time without making contact with the wafer. More than one puddle may be formed within which the photoresist dispense nozzles are washed. The spin chuck may be spun slowly to evenly distribute the puddle over the wafer and/or to facilitate cleaning the nozzles. The photoresist nozzles may be moved in a back and forth direction along a linear axis to wash the nozzles. The photoresist cleaning solvent may be dispensed while the spin chuck is rotating slowly and/or the photoresist dispense nozzles are moved back and forth along the linear axis. The photoresist dispense nozzles may be soaked in or make contact with the puddle with or without linear movement of the nozzles and/or rotational movement of the spin chuck for cleaning. Once the cleaning process is complete, the spin chuck may be spun quickly to spin off photoresist cleaning solvent from the wafer.

A system of the present invention includes a process controller programmable to control the positioning of equipment of the coater module and dispensation of the photoresist cleaning solvent to clean the photoresist dispense nozzles present. The process controller is programmable to control positioning of an arm supporting, for example, the photoresist dispense and edge bead dispense nozzle array over a central portion of a wafer disposed on a spin chuck. The process controller is programmable to control positioning of the arm in a back and forth linear motion to facilitate washing the photoresist dispense nozzles. In embodiments where the photoresist dispense nozzle and the edge bead dispense nozzle are disposed on separate positioning mechanisms, the process controller is programmable to move each positioning mechanism to a position where the nozzles are disposed above a central portion or above other desired positions of the wafer. The process controller is also programmable to dispense photoresist cleaning solvent over the central area, forming a puddle over the central area, to vertically position the spin chuck to a position where the photoresist dispense nozzle contacts the puddle for photoresist cleaning and/or to rotate the spin chuck. The process controller may be programmable to simultaneously and/or consecutively rotate the spin chuck while moving the arm in a linear back and forth motion.

DETAILED DESCRIPTION OF THE DRAWINGS

DETAILED DESCRIPTION

Figure 1:
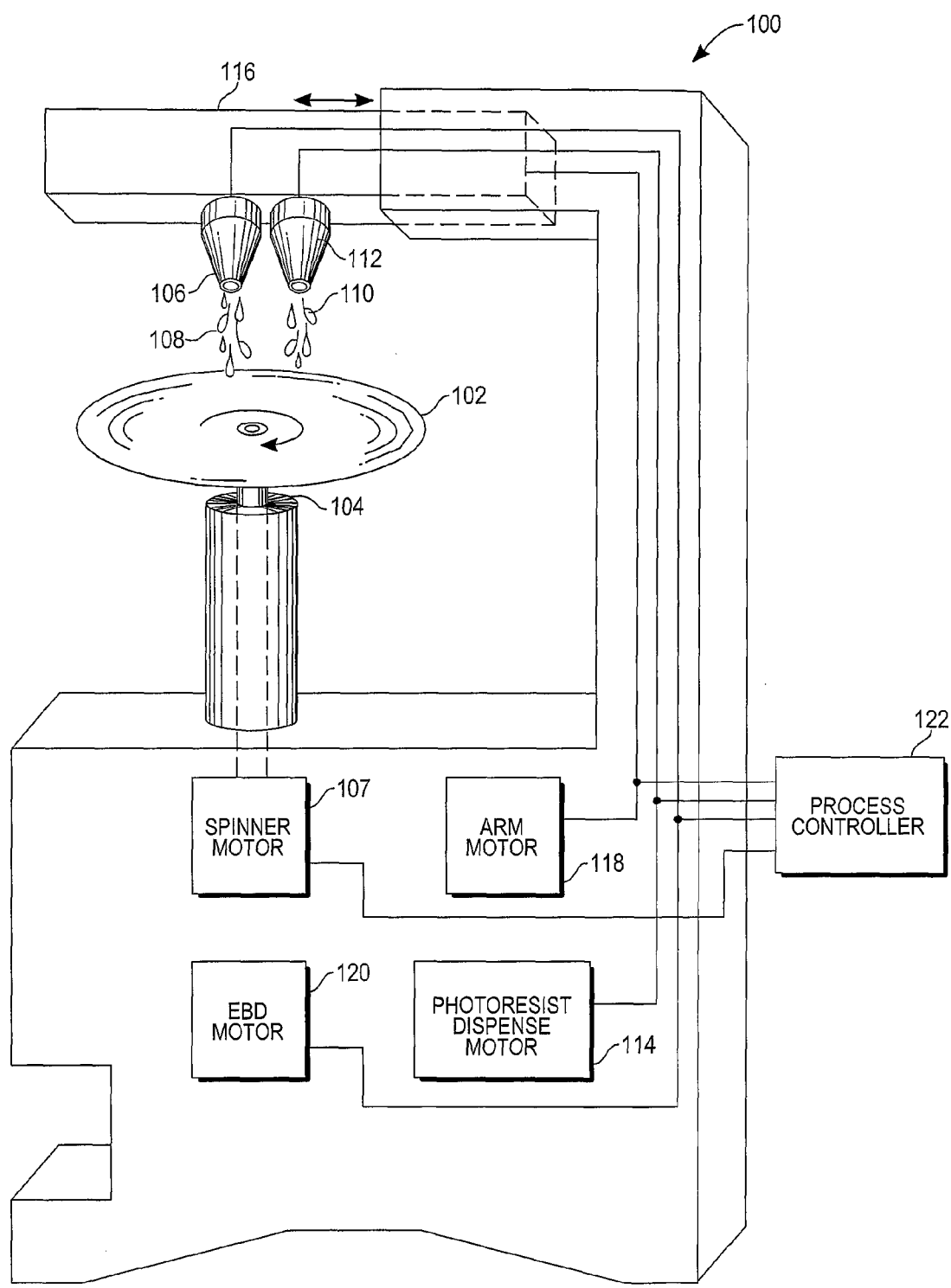
FIG. 1 is a perspective view of a wafer processing coater module of the prior art.
Figure 2:
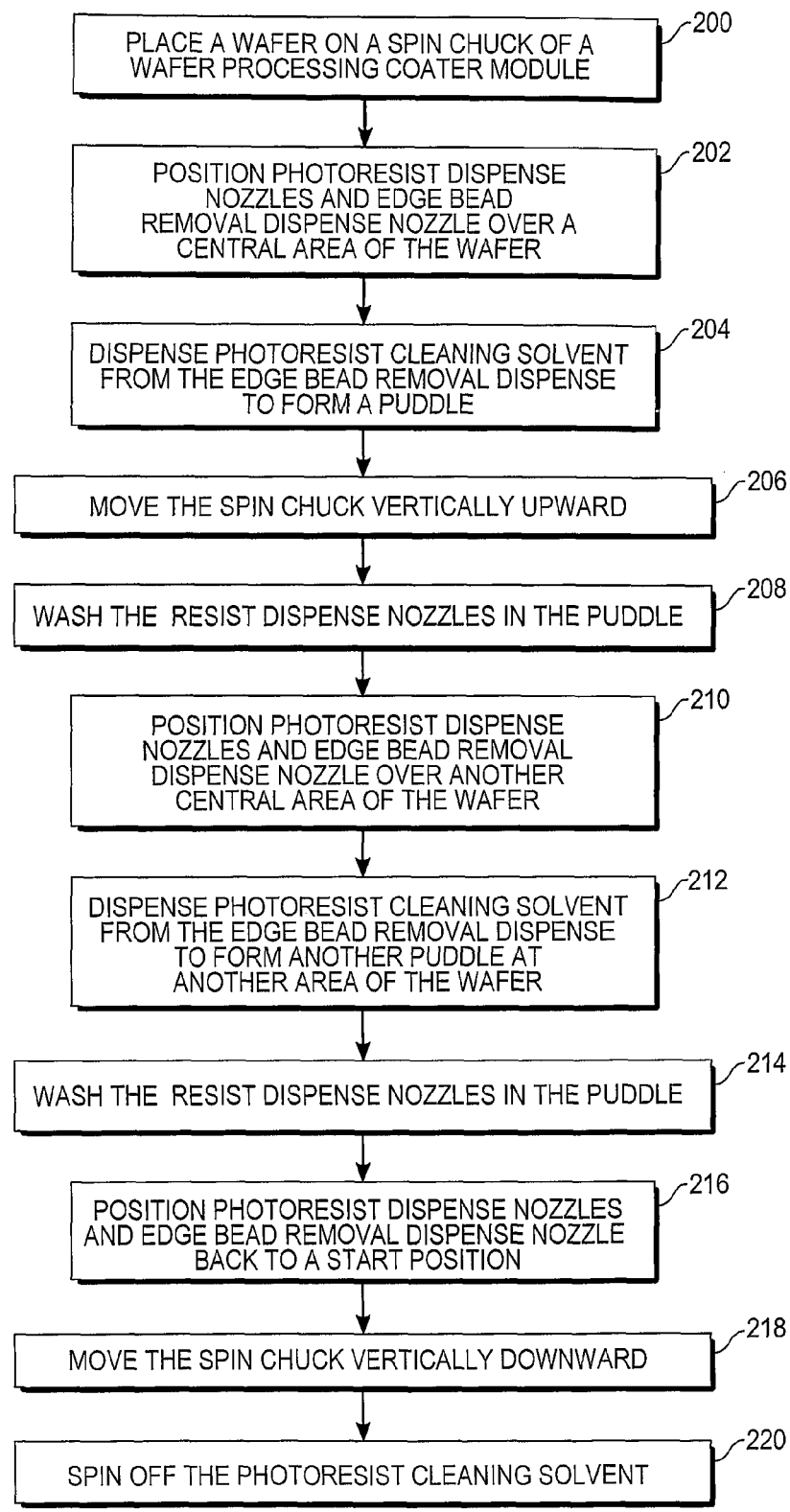
FIG. 2 is a flow chart of one embodiment of a method of the present invention.
Figure 3:
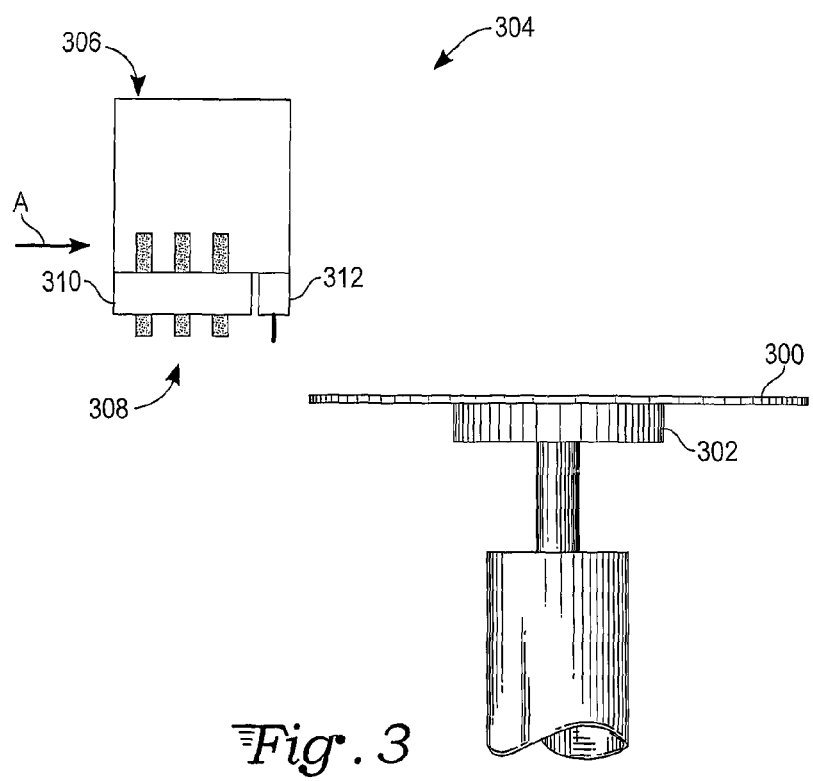
FIGS. 3-9 are diagrams illustrating the method of FIG. 2.

With reference to FIG. 2, method steps of an embodiment of the present invention are seen. With reference to step 200 of FIG. 2 and to FIG. 3, a wafer 300, or other substrate, is placed on a spin chuck 302 of a wafer processing coater module 304. The coater module 304 includes an arm 306, such as a traversing dispense arm, supporting nozzles 308 on a nozzle mount 310 and supporting edge bead dispense 312. The arm is for example, an automated or robotic arm. The arm 306 may be controlled by a stepper motor (not shown) for precise positioning. As shown by arrow A in FIG. 3 and with reference to step 202 of FIG. 2, the arm 306 is moved toward a position in which the edge bead dispense nozzle 312 is disposed above, for example, a central portion of the wafer 300 as seen in FIG. 4.

Figure 4:
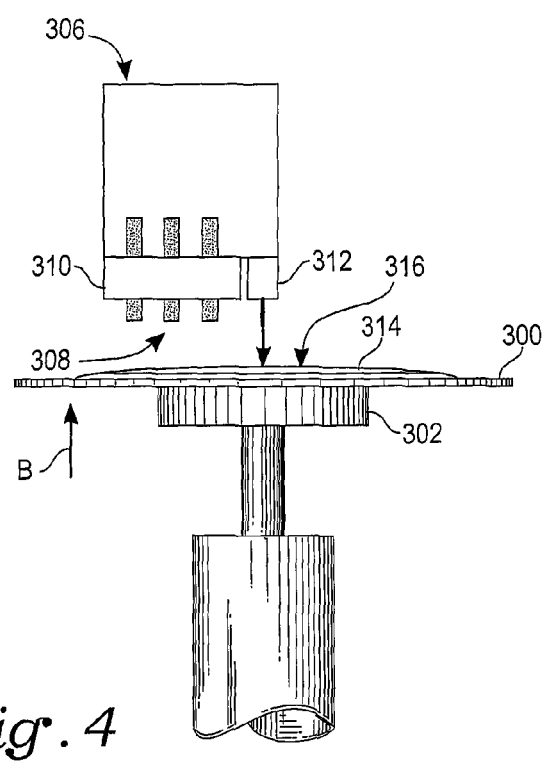

With reference to step 204 of FIG. 2 and to FIG. 4, the edge bead dispense nozzle 312 may begin to dispense a photoresist cleaning solvent (as indicated by the downwardly pointing arrow extending from dispense nozzle 312) onto a central portion of the wafer 300 forming a puddle 316 in the central portion of the wafer. The photoresist cleaning solvent includes photoresist cleaning solvents known in the art. In one example, the solvent has properties that allow it to form a meniscus shape 314 when dispensed on the wafer surface.

Figure 5:
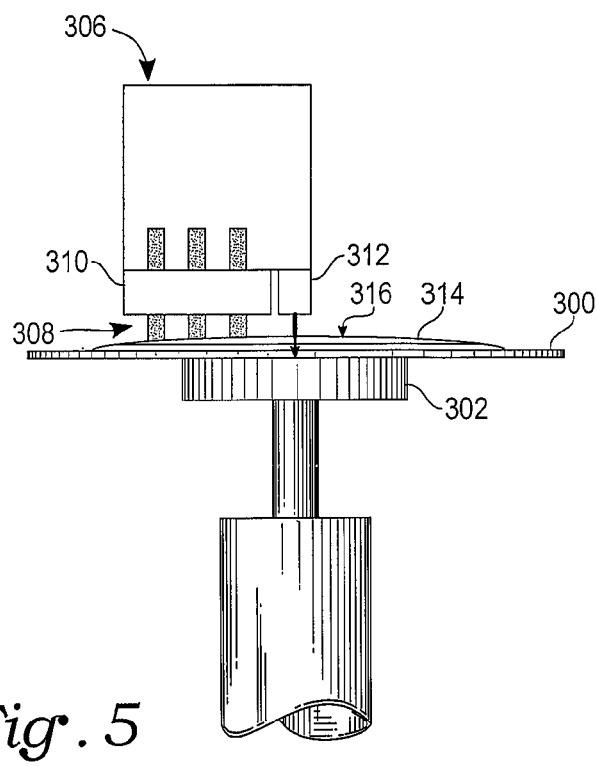

With reference to steps 206 and 208 of FIG. 2 and to FIGS. 4 and 5, the spin chuck is moved vertically upward in direction B to place the photoresist dispense nozzles 308 in contact with the puddle 316 as seen in FIG. 5 so that they may be washed in the puddle. Photoresist cleaning solution continues to be dispensed. Washing may be accomplished by soaking the nozzles in the puddle, by rotating the spin chuck 302 to facilitate cleaning and/or by a linear back and forth motion of the arm to facilitate cleaning.

Figure 6:
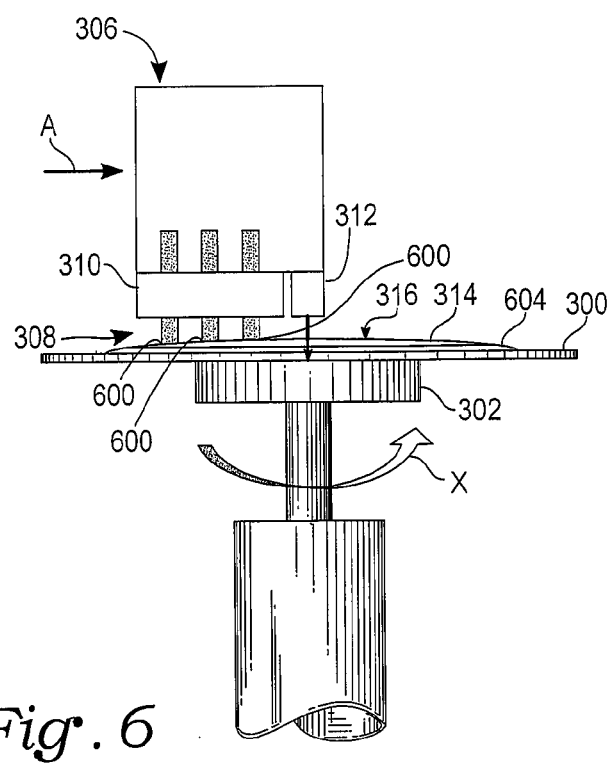

With reference to step 208 of FIG. 2 and to FIG. 6, the spin chuck 302 may be spun, preferably slowly, as indicated by the direction of arrow X or in another direction, to more evenly distribute the puddle 316 on the wafer and/or to facilitate cleaning of the photoresist dispense nozzles. Alternatively or additionally, the arm 306 may be moved back and forth so that the photoresist dispense nozzles are moved linearly back and forth in the puddle sloshing solvent across, for example, the tips or lower portions of the nozzle to facilitate nozzle cleaning. The linear movement of the arm and rotational movement of the spin chuck may occur simultaneously or consecutively.

With reference to step 208 and to FIGS. 5 and 6, the photoresist dispense nozzles are washed in the puddle for a desired amount of time to remove photoresist (typically dried photoresist) from the nozzles. For example, a tip portion of each photoresist nozzle is soaked. In one embodiment while the nozzles are soaking, photoresist cleaning solvent is continuously dispensed. In another embodiment, while the photoresist solvent is being dispensed and the nozzles are soaking, the spin chuck is rotating slowly and/or arm 306 is moving in a linear direction back and forth. In one embodiment, the photoresist dispense nozzles 308 do not make contact with the wafer and contact higher inner portions 602 of the meniscus, as opposed to the lower edge portions 604. In one embodiment, a gap between the lower surface of the photoresist dispense nozzles 308 and the wafer 300 on the spin chuck 302 is 0.060 inches.

Figure 7:
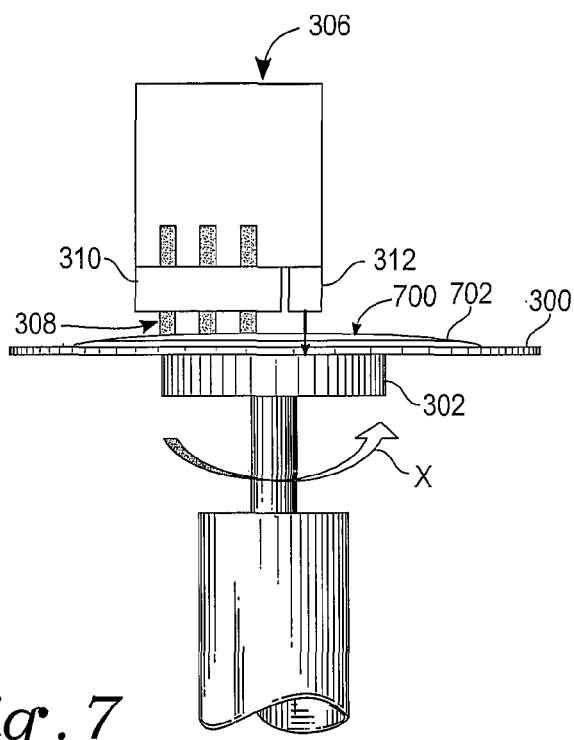

With reference to step 212 of FIG. 2, the arm 306 may be moved again in direction A (FIG. 6) to a position shown in FIG. 7 where the edge bead dispense nozzle is able to dispense photoresist cleaning solvent on another central wafer location to form a second puddle 700 used to clean the nozzles.

With reference to step 214 of FIG. 2 and to FIG. 7, the edge bead dispense nozzle 312 dispenses photoresist cleaning solvent at another central wafer position to form puddle 700 and the puddle may be spun, preferably slowly, by spin chuck 302 in a direction indicated by the arrow X or in another direction to more evenly distribute the puddle and/or to facilitate cleaning of the photoresist dispense nozzles. The puddle may include a meniscus 702. Alternatively or additionally, the arm 306 may be moved back and forth so that the photoresist nozzles are moved back and forth in the puddle sloshing solvent across, for example, the tips or lower portions of the nozzles to facilitate nozzle cleaning. The linear movement of the arm and the rotational movement of the spin chuck may occur consecutively or simultaneously.

With reference to step 214 and to FIG. 7, the photoresist dispense nozzles 308 are washed in the puddle for a desired amount of time to remove photoresist (typically dried photoresist) from the nozzles. In one embodiment, while the nozzles are soaking, photoresist cleaning solvent is dispensed. In another embodiment, while the photoresist solvent is being dispensed and the nozzles are soaking, the spin chuck is rotating slowly and/or the arm 306 is moving in a linear direction back and forth. In one embodiment, the photoresist dispense nozzles do not make contact with the wafer and contact higher portions of the meniscus 702.

Figure 8:
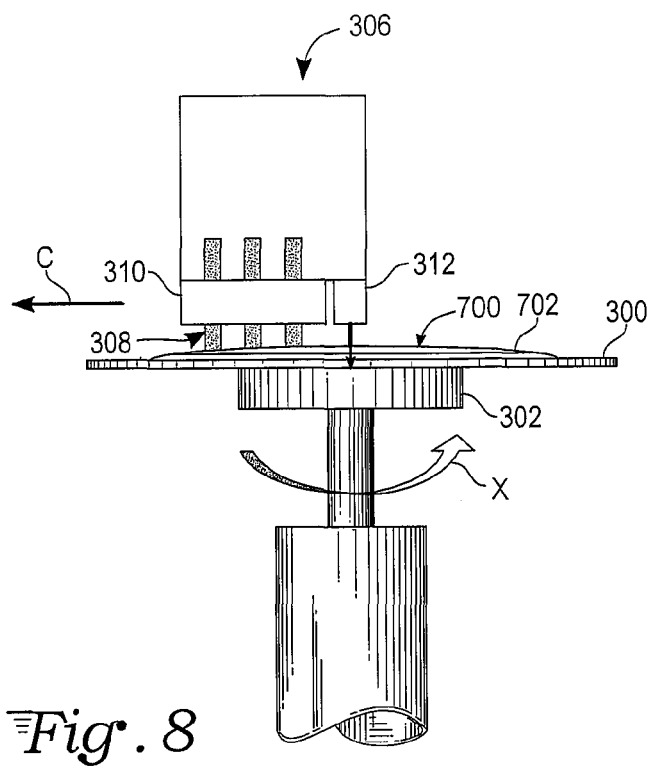
Figure 9:
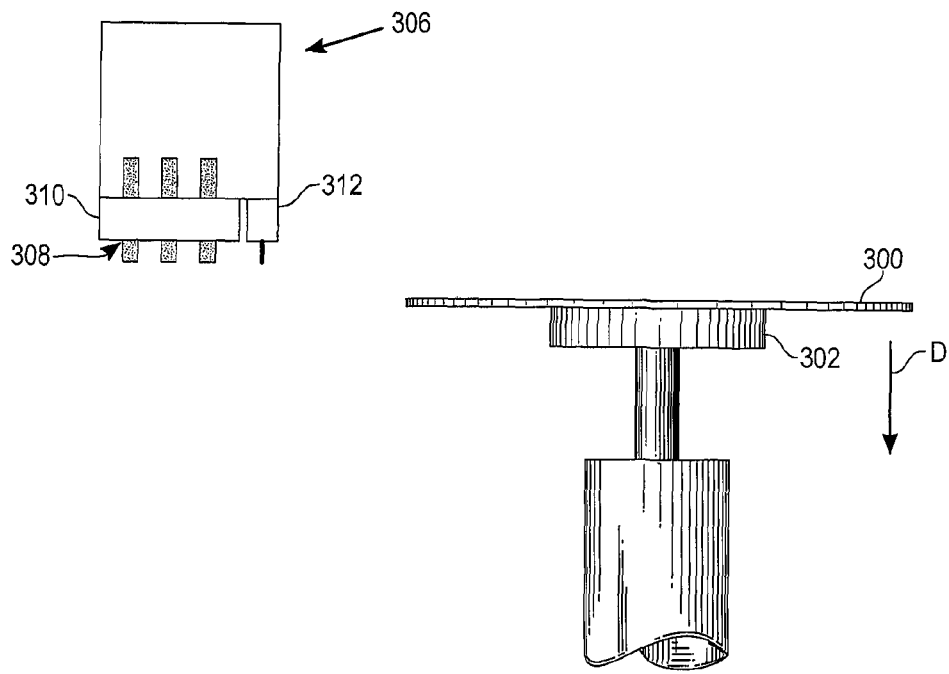

With reference to steps 216 and 218 of FIG. 2 and to FIGS. 8 and 9, the photoresist dispense nozzles 308 are moved back to a start position in the direction indicated by arrow C and the spin chuck is moved back to a start position with a vertical movement in the direction indicated by arrow D. As shown in FIG. 9 and with reference to step 220 of FIG. 2, the photoresist cleaning solvent is spun off the wafer by, for example, spinning the chuck at a faster speed.

The steps need not be performed in the order depicted and not all of the steps are necessary in the cleaning process. For example, the spin chuck 302 may be spun before, during or after puddle and photoresist dispense nozzles make contact. Alternatively, the photoresist dispense nozzles 308 may make contact with and/or be soaked in a puddle formed without spinning the spin chuck or moving the arm linearly back and forth. One or more puddles may be formed on the wafer. Instead of, or in addition to, the spin chuck 302 being moved vertically upward to a position where the photoresist dispense nozzles 308 make contact with the puddle as indicated by step 206, the photoresist dispense nozzles may move in a vertical direction toward the puddle. Also, the photoresist dispense nozzles and the edge bead dispense nozzle may be moved separately from one another to a position above the wafer. This would be the case, for example, where the photoresist dispense nozzles 308 and the edge bead dispense nozzle 312 have different moving mechanisms. Though the method is described using multiple photoresist dispense nozzles, it is understood that only one, or however many photoresist dispense nozzles are present, may be cleaned. A coater module may have only one photoresist dispense nozzle.

If desired, a dummy dispense of photoresist from the photoresist nozzles may be performed after the cleaning process.

Figure 10:
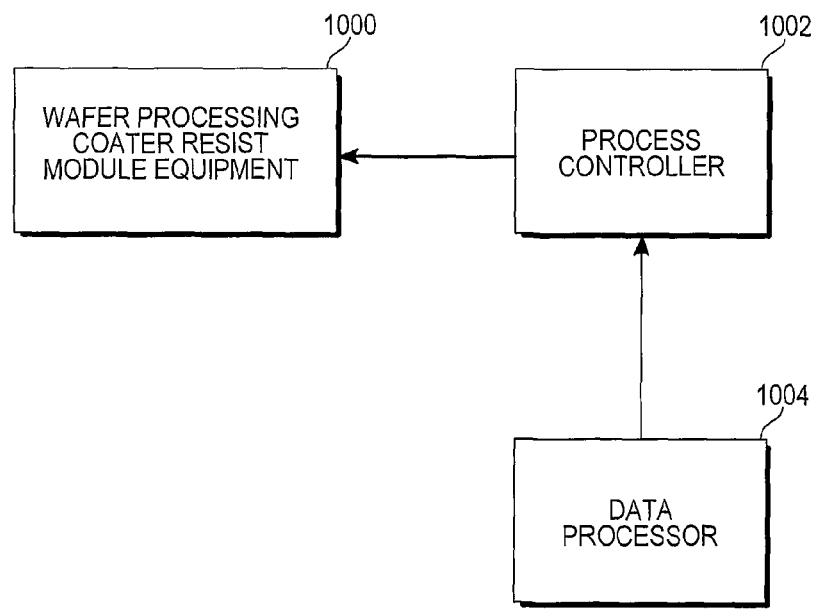
FIG. 10 is a block diagram of a system of the present invention.

With reference to FIG. 10, a system of the present invention is seen. In one embodiment, the system comprises wafer processing coater resist module equipment 1000 in communication with a process controller 1002 in communication with a data processor 1004. The wafer processing coater resist module equipment is, in one example, coater module equipment known in the art and/or coater module equipment described herein. Motors may be used to position components of the equipment and a process controller may communicate with the motors to position the components. In one example, the wafer processing coater resist module equipment comprises at least one radially positionable photoresist dispense nozzle 308 (see FIG. 3, arrow A, FIG. 6 arrow A, and FIG. 8, arrow C), a radially positionable edge bead removal dispense 312 (see FIG. 3, arrow A, FIG. 6 arrow A, and FIG. 8, arrow C), and an axially positionable spin chuck 302 (see FIG. 4, arrow B, FIG. 9, arrow D) having a wafer 300 disposed thereon.

In one embodiment, the process controller 1002 is programmable or driven by data processor 1004 to control radial positioning of the at least one photoresist dispense nozzle 308 over the wafer 300 (for example, over a central portion of the wafer in a linear direction back and forth), radial positioning of the edge bead removal dispense nozzle 312 over a central portion of the wafer 300 and/or in a linear direction back and forth, and/or dispensing of photoresist cleaning solvent from the edge bead removal dispense nozzle 312 onto the central portion of the wafer 300 and axial positioning of the spin chuck 302 relative to the photoresist dispense nozzles 308. The process controller may be programmed to position the spin chuck 302 to a position at which the photoresist dispense nozzles 308 contacts the photoresist cleaning solvent or puddle dispensed on the wafer 300 for washing. The process controller may be programmed to return the nozzles to a start position.

In a preferred embodiment, the process controller is programmable to control positioning of the spin chuck to a position where the at least one photoresist dispense nozzle contacts the photoresist cleaning solvent or puddle dispensed on the wafer without contacting the wafer. The process controller may be programmed to return the spin chuck to a start position.

In one embodiment, the process controller is programmable to control axial movement of the spin chuck upwardly toward the photoresist dispense nozzles 308 to a position in which a gap between the photoresist dispense nozzles and wafer on the spin chuck is about 0.060 inches.

In one embodiment, the process controller is programmable to control rotation and rotational speed of the spin chuck with rotational speed being, for example, relatively slow when cleaning the nozzles, and relatively fast when spinning off the photoresist cleaning solvent.

The process controller may be programmed to simultaneously and/or consecutively rotate the spin chuck while moving the arm in a linear back and forth motion.

What is claimed is:

1. In a wafer processing photoresist coater module, a method for removing photoresist from a photoresist dispense nozzle of a nozzle array of at least one photoresist dispense nozzle and an edge bead dispense nozzle comprising:
positioning an edge bead removal dispense nozzle of the nozzle array over a central area of a substrate disposed on a spin chuck of the coater module;
dispensing a photoresist cleaning solvent from the edge bead removal dispense nozzle and forming a first puddle of cleaning solvent in the central area of the wafer; and
washing the photoresist dispense nozzle in the puddle for a select amount of time, thereby removing photoresist from the photoresist dispense nozzle.

2. The method of claim 1 wherein the substrate is a wafer.

3. The method of claim 1 wherein the photoresist dispense nozzle is supported above the substrate in a non contact relation with the substrate.

4. The method of claim 1 wherein washing occurs by soaking a portion of the photoresist dispense nozzle in the puddle, moving the photoresist dispense nozzle back and forth in the puddle and/or slow spinning the spin chuck to facilitate removal of photoresist from the photoresist dispense nozzle.

5. The method of claim 1, further comprising continuously dispensing the photoresist cleaning solvent while washing.

6. The method of claim 5, further comprising dispensing additional photoresist cleaning solvent from the edge bead removal dispense nozzle, forming a second puddle and washing the photoresist dispense nozzle in the second puddle thereby removing photoresist from the photoresist dispense nozzle.

7. The method of claim 6, further comprising positioning the nozzle array over another select area of the substrate disposed on the spin chuck of the coater module prior to dispensing additional photoresist cleaning solvent from the edge bead removal dispense nozzle.

8. The method of claim 1, further comprising moving the nozzle array away from the spin chuck after washing.

9. The method of claim 8, further comprising spinning the spin chuck to spin the photoresist cleaning solvent off of the substrate.

10. The method of claim 9, further comprising lowering the spin chuck before or after spinning the spin chuck to spin the photoresist cleaning solvent off of the substrate.

11. The method of claim 9, further comprising performing a dummy dispense of resist from the photoresist nozzle.

12. The method of claim 1, wherein the nozzle array is disposed on a traversing dispense arm.

13. The method of claim 1, wherein the portion of the photoresist nozzle that is washed is a tip portion.

14. The method of claim 1, wherein the spin chuck is moved vertically upwardly toward the nozzle array after dispensing the photoresist cleaning solvent.

15. The method of claim 1 wherein the spin chuck is moved vertically upwardly toward the nozzle array before dispensing the photoresist cleaning solvent.

16. The method of claim 1 further comprising moving the spin chuck vertically upward toward the nozzle array such that a gap between the photoresist dispense nozzle and substrate on the spin chuck is about 0.060 inches.

17. The method of claim 1, wherein the first puddle includes a meniscus and the photoresist nozzle is washed in a higher part of the meniscus.

18. In a wafer processing photoresist coater module including at least one photoresist dispense nozzle and an edge bead removal dispense nozzle, a method for removing photoresist from the photoresist nozzle comprising:
dispensing a photoresist cleaning solvent from the edge bead removal dispense onto a portion of a substrate disposed on a spin chuck, the photoresist cleaning solvent forming a puddle of photoresist cleaning; and making contact between the photoresist dispense nozzle and puddle for a select amount of time, thereby removing photoresist from the photoresist dispense nozzle.

* * * * *